United States Patent
Murakami

[11] Patent Number: 6,025,748
[45] Date of Patent: Feb. 15, 2000

[54] PRECHARGE DEVICE FOR SEMICONDUCTOR INTEGRATED CIRCUIT DEVICE

[75] Inventor: Kiyoharu Murakami, Yokohama, Japan

[73] Assignee: Kabushiki Kaisha Toshiba, Kawasaki, Japan

[21] Appl. No.: 09/036,962

[22] Filed: Mar. 9, 1998

[30] Foreign Application Priority Data

Mar. 14, 1997 [JP] Japan ..................................... 9-079193

[51] Int. Cl.[7] .................................................. H03K 17/01
[52] U.S. Cl. ......................... 327/530; 327/538; 327/541; 327/544; 326/30
[58] Field of Search ..................................... 327/143, 198, 327/170, 563, 374, 376, 108, 109, 544, 538, 541, 545, 546, 530; 326/87, 30

[56] References Cited

U.S. PATENT DOCUMENTS

| 5,841,317 | 11/1998 | Ohamori et al. | ......................... 327/563 |
| 5,849,244 | 4/1999 | Ukita | ..................................... 327/541 |
| 5,852,383 | 12/1998 | Rombach | ................................. 327/538 |
| 5,880,624 | 3/1999 | Koyanagi et al. | ..................... 327/541 |

*Primary Examiner*—Timothy P. Callahan
*Assistant Examiner*—Hiep Nguyen
*Attorney, Agent, or Firm*—Loeb & Loeb LLP

[57] ABSTRACT

The present invention provides a semiconductor integrated circuit device in which its internal node can be precharged at a high speed while suppressing current dissipation as in a conventional device by adding a circuit which assists charging when a power supply voltage begins to rise and a method for precharging. The semiconductor integrated circuit device includes a precharge circuit which comprises a first charge circuit, a second charge circuit which is higher in charging speed than the first charge circuit, a charged level detect circuit for detecting the charged level of the internal node when the first charge circuit is being driven, and a charged level stabilization circuit. The precharge circuit may further comprise a charged level control circuit. Although, in a conventional circuit, charging of the internal node is effected by only the first charge circuit which has high resistivity and low driving capability, in the present invention the second charge circuit which is high in driving capability is used to assist the first charge circuit to charge the node after the charged level of the node by the first charge circuit has reached a predetermined level. Thus, the precharging time of a function switching circuit can be reduced.

6 Claims, 6 Drawing Sheets

PRECHARGE DEVICE FOR SEMICONDUCTOR INTEGRATED CIRCUIT DEVICE

BACKGROUND OF THE INVENTION

The present invention relates to a precharge circuit which permits a supply voltage for a semiconductor integrated circuit device to rise quickly.

Figure 1:
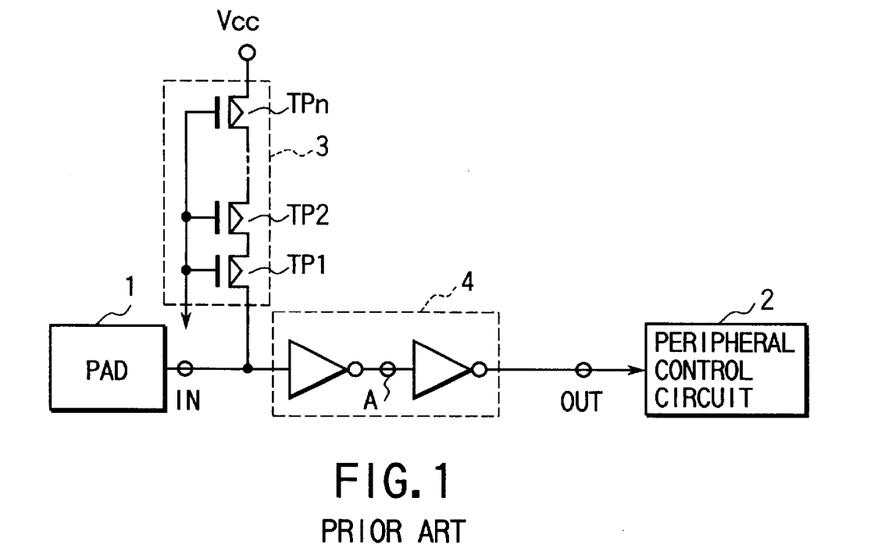
FIG. 1 is a schematic of a precharge circuit incorporated in a conventional function switching circuit.

A conventional precharge circuit for semiconductor integrated circuit devices will be described with reference to FIG. 1, which illustrates an arrangement of a semiconductor integrated circuit device formed in a semiconductor substrate in block and circuit diagram form. The semiconductor substrate is formed with an external terminal (pad) 1 through which a signal is externally applied to the integrated circuit and a peripheral control circuit 2. The peripheral control circuit is connected to an internal circuit (not shown) such as a memory. The integrated circuit formed in the semiconductor substrate is comprised of the internal circuit and the peripheral control circuit 2. Between the pad 1 and the peripheral control circuit 2 is placed a charged level stabilization circuit 4, which is constructed from CMOS inverters INV1 and INV2. Between the pad 1 and the charged level stabilization circuit 4 is connected a charge circuit 3, which is constructed from n number of series-connected P-channel MOS transistors TP1, TP2 . . . , and TPn. These MOS transistors have their respective gates connected to ground potential Vss. The MOS transistor TPn has its source connected to supply voltage Vcc, while the MOS transistor TP1 has its drain connected to the input of the charged level stabilization circuit 4, i.e., a node IN associated with the pad 1 on the semiconductor substrate side. The output of the charged level stabilization circuit 4 is connected through a node OUT to the peripheral control circuit 2.

The circuit thus arranged is used in switching functions (e.g., EDO (Extended Data Out), FPM (First Page Mode), etc.) which are usually built into a semiconductor integrated circuit device such as a semiconductor memory. Hereinafter, such a circuit is referred to as a function switching circuit. In the circuit of FIG. 1, the voltage level at the output node OUT is set by precharging the node IN to a desired voltage level through the series-connected MOS transistors or by directly applying a supply voltage to the pad 1. In order to operate the chip in the default state, the node IN is precharged by the precharge circuit itself. On the other hand, a supply voltage, for example, ground potential (Vss), is applied to the pad 1 only when it is required to switch the semiconductor integrated circuit from one function to another.

Figure 2:
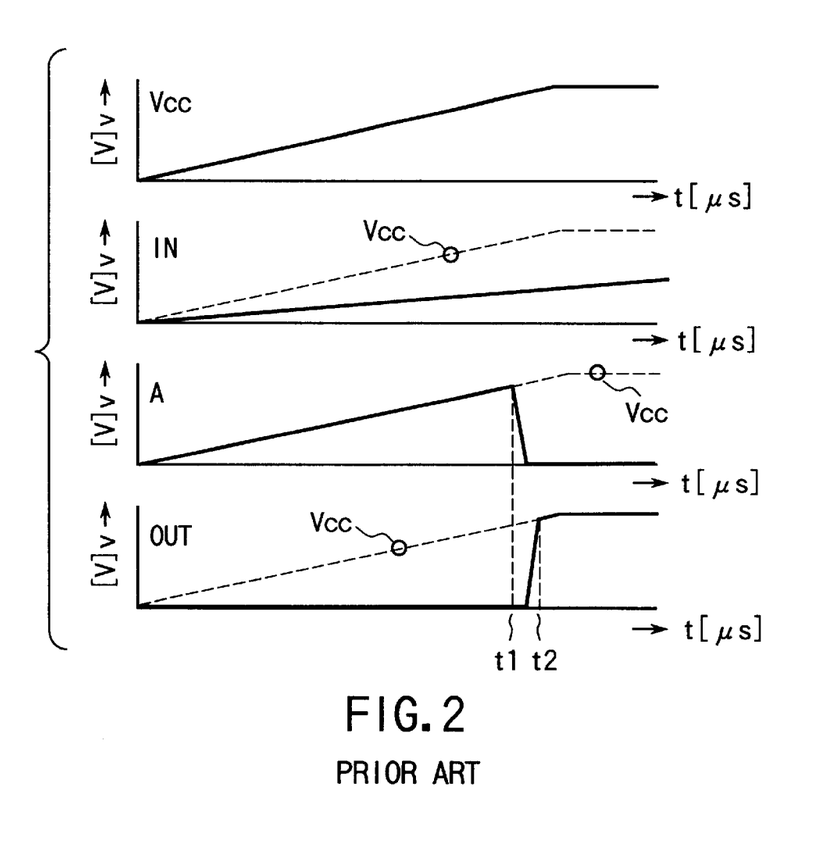
FIG. 2 are timing diagrams illustrating precharged states of respective nodes in the function switching circuit of FIG. 1.

Next, a description will be given of the operation when the supply voltage is risen (precharged) without applying the supply voltage to the pad with reference to FIG. 2, which are timing diagrams illustrating the precharge states at the respective nodes of the function switching circuit of FIG. 1. When the supply voltage Vcc rises as shown in FIG. 2, the node IN starts to be charged towards the supply voltage Vcc through the P-channel MOS transistors TP1, TP2, . . . TPn which comprise the charge circuit 3. The dotted line shows an imaginary supply voltage Vcc toward which the node IN starts to be charged. It should be noted here that the gate width W and the gate length L of each P-channel MOS transistor is set such that W<<L in order to reduce an increase in current flowing through the transistor. To reduce the effective gate width W, n number of P-channel MOS transistors are connected in series.

With such an arrangement, the P-channel MOS transistors, which are very highly resistive, cause the node IN to charge gradually as shown in FIG. 2. During this charging interval, the node A between the inverters INV1 and INV2 is at a supply voltage Vcc, and the node OUT is at ground potential. When the node IN is charged up to the threshold voltage of the inverter INV1 (t=t1), the inverter INV1 is turned ON, causing the node A to discharge to ground potential. After that, the inverter INV2 operates to cause the node OUT to go to Vcc at time t2. Thus, the precharging of the function switching circuit terminates. When the supply voltage Vcc is directly applied to the pad 1, a voltage in phase with that at the node IN is outputted onto the node OUT, so that the node OUT is charged to follow the supply voltage.

The conventional function switching circuit switches the functions (e.g., EDO, FPM, etc.) of the semiconductor integrated circuit by setting the node IN to either Vcc or Vss. In this case, Vss is applied from outside (through the pad), while Vcc is applied through the charge circuit.

A problem with the conventional circuit is that the node IN cannot be charged quickly to Vcc through the use of the charge circuit. A through-current flows between Vcc and the pad when the pad is connected to Vss. To reduce the through-current, the current path in the charge circuit is made highly resistive. However, this provides a disadvantage that the node IN cannot be precharged quickly.

BRIEF SUMMARY OF THE INVENTION

It is an object of the present invention to provide a semiconductor integrated circuit which has an additional circuit that assists charging when a supply voltage is raised to permit fast precharging while reducing current dissipation as with the conventional circuit.

The present invention is characterized by arranging a function switching circuit, which selects between direct application of a power supply voltage to a semiconductor integrated circuit device through a pad and application of a supply voltage to the integrated circuit device through a precharge circuit, such that the precharge circuit uses a first charge circuit which is the same as that in the conventional device and a second charge circuit which is higher in driving capability than the first charge circuit and the second charge circuit is operated when the charged level by the first charge circuit reaches a predetermined level.

Although, in the conventional device, an internal node is charged by only a charge circuit which has high resistivity and low driving capability, in the present invention the second charge circuit is used to assist the first charge circuit to charge the internal node after the charged level of the node by the first charge circuit has reached a predetermined level. This allows the precharging time of the function switching circuit to be reduced.

A first feature of the semiconductor integrated circuit device of the present invention is that the precharge circuit comprises a first charge circuit, a second charge circuit higher in charging speed than the first charge circuit, a charged level detect circuit for detecting a charged level of the node by the first charge circuit, and a charged level stabilization circuit. A charged level control circuit may be further provided. The second charge circuit may be driven after the charged level detect circuit has detected that the charged level of the node by the first charge circuit reached the predetermined level. The charging speed of the second charge means may be decreased by the charged level control means.

A semiconductor integrated circuit device of the present invention is characterized by comprising: a first P-channel MOS transistor having its gate connected to ground potential and its source connected a power supply voltage; a first CMOS inverter having its input connected to the drain of the first P-channel MOS transistor; a second inverter having its input connected to the output of the first inverter; a second P-channel MOS transistor having its gate connected to the drain of the first P-channel MOS transistor and its source connected to a power supply voltage; an N-channel MOS transistor having its gate connected to the drain of the first P-channel MOS transistor, its source connected to a ground potential and its drain connected to the drain of the second P-channel MOS transistor; a capacitor connected between the drain of the N-channel MOS transistor and the ground potential; and a third P-channel MOS transistor having its gate connected to the drain of the N-channel MOS transistor, its source connected to a power supply voltage, and its drain connected to the drain of the first P-channel MOS transistor.

A method for precharging a semiconductor integrated circuit device in accordance with the present invention comprises the steps of: driving a first charge means which is low in charging speed; detecting a charged level of the first charge means by means of charged level detect means; and driving second charge means which is high in charging speed after a predetermined potential is detected by the charged level detect means.

It is Vss that is supplied from outside. If Vcc were supplied from outside, charging would not be required. That is, switching between the functions of the semiconductor integrated circuit device is made by setting the node IN to either Vcc or Vss. To set the node IN to Vcc, charging means is used. A problem with the conventional circuit is that fast charging can not be attained.

A through-current flows between the Vcc terminal of the charge circuit and the pad when the pad is connected to Vss. To suppress such a current, the charge circuit is set highly resistive. On the other hand, setting the charge circuit highly resistive will provide a disadvantage that the node IN cannot be precharged at high speed. The present invention is characterized by addition of a circuit which permits the node IN to be precharged at high speed with current dissipation kept unchanged.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 3:
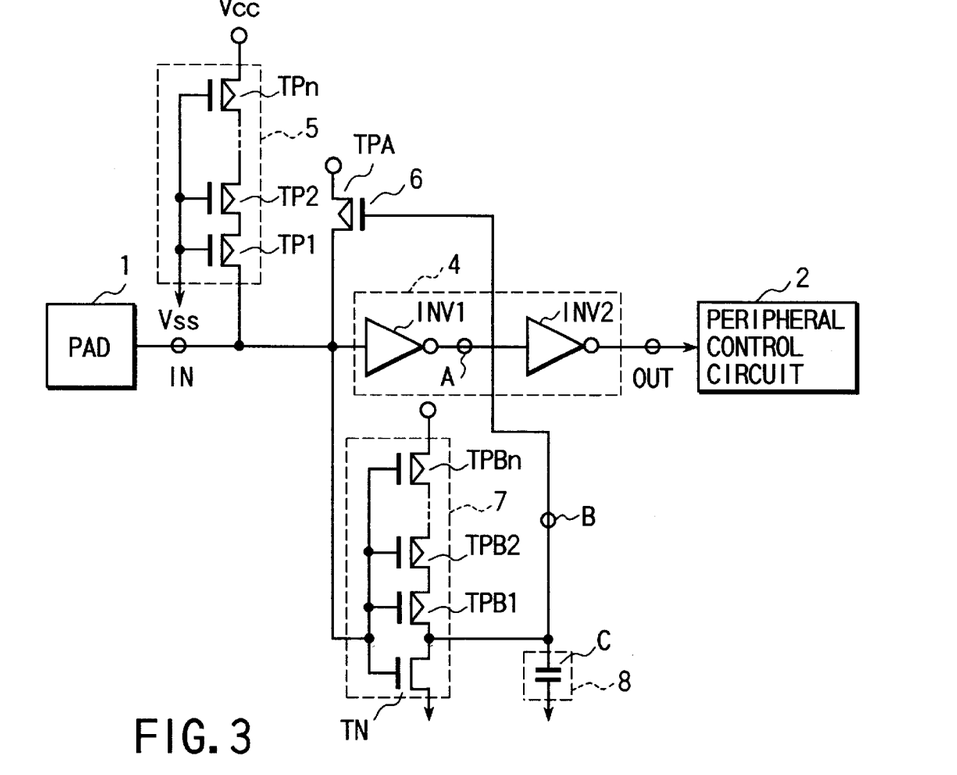
FIG. 3 is a schematic of a precharge circuit incorporated in a function switching circuit of the present invention.

First, a precharge circuit formed in a semiconductor integrated circuit device of the present invention will be described with reference to FIG. 3, which illustrates an arrangement of the semiconductor integrated circuit device manufactured into a semiconductor substrate. The semiconductor substrate is formed with an external terminal (pad) 1 which receives a signal from outside of the semiconductor integrated circuit. Further, the semiconductor substrate is formed with a peripheral control circuit 2, which is connected to an internal circuit (not shown) such as a memory. The integrated circuit is composed of the internal circuit and the peripheral control circuit. Between the pad 1 and the peripheral control circuit 2 is placed a charged level stabilization circuit 4, which is constructed from CMOS inverters INV1 and INV2. Between the pad 1 and the charged level stabilization circuit 4 is connected a first charge circuit 5. Between the first charge circuit 5 and the charged level stabilization circuit 4 is connected a second charge circuit 6 which is higher in charging speed than the first charge circuit. To the first charge circuit 5 is connected a charged level detect circuit 7 which detects the charged level of the node In by the first charge circuit. IN addition, to suppress overcharge by the second charge circuit, a charged level control circuit 8 is formed as required.

The precharge circuit operates in the following manner. First, the first charge circuit which is slower in charging speed is driven. Next, the charged level by the first charge circuit being driven is detected by the charged level detect circuit 7. Then, the second charge circuit which is faster in charging speed is driven at the time when the level detect circuit 7 detects a predetermined potential. This sequence permits the node IN to be charged to a power supply voltage Vcc in a short time in comparison with the conventional circuit.

Each section of the precharge circuit will be described in detail hereinafter.

The first charge circuit 5 comprises a series combination of n number of first P-channel MOS transistors TP1, TP2, . . . , and TPn, which have their respective gates connected to ground potential Vss. The transistor TPn has its source connected to supply voltage Vcc. The transistor TP1 has its drain connected to the input of the charged level stabilization circuit 4, i.e., the input node IN on the semiconductor substrate side of the pad 1 to which a signal is applied from outside of the integrated circuit device. The output of the charged level stabilization circuit 4 is coupled to the peripheral control circuit 2 via the output node OUT.

The second charge circuit 6 comprises a P-channel MOS transistor TPA, which has its source connected to the supply voltage Vcc and its drain connected to the drain of the first P-channel MOS transistor TP1.

The charged level detect circuit 7 comprises an N-channel MOS transistor TN and a series combination of n number of second P-channel MOS transistors TPB1, TPB2, . . . , and TPBn, which have their respective gates connected to the drain of the first P-channel MOS transistor TP1. The second P-channel MOS transistor TPBn has its source connected to the supply voltage Vcc. The N-channel MOS transistor TN has its gate connected to the drain of the first P-channel MOS transistor TP1, its drain connected to the drain of the second P-channel MOS transistor TPB1 and the gate of the P-channel MOS transistor TPA, and its source connected to ground potential Vss.

The charged level control circuit 8 comprises an N-channel MOS capacitor C connected between the source of the N-channel MOS transistor TN and ground potential Vss. A capacitor electrode that is connected to the source of the N-channel MOS transistor TN is connected to the gate of the P-channel MOS transistor TPA.

The circuit thus arranged serves as a function switching circuit which is used to switch the functions (e.g., EDO, FPM, etc.) that are usually incorporated into semiconductor integrated circuit devices, such as semiconductor memories. The output level at node OUT is set by precharging the function switching circuit or directly applying the supply voltage to the pad. More specifically, to operate the chip in the default state, the switching circuit itself performs precharging to set the output level at node OUT. On the other hand, a certain supply voltage is applied to the pad in changing the function of the semiconductor integrated circuit device. The first P-channel MOS transistors TP1, TP2, . . . , and TPn and the second P-channel MOS transistors TPB1, TPB2, . . . , and TPBn each have their respective gate length L and gate width W set such that W<<L in order to reduce current flowing through each transistor. Since a plurality of MOS transistors are connected in series, the first charge circuit is slower in charging speed than the second charge circuit in which only one transistor is used.

Figure 4:
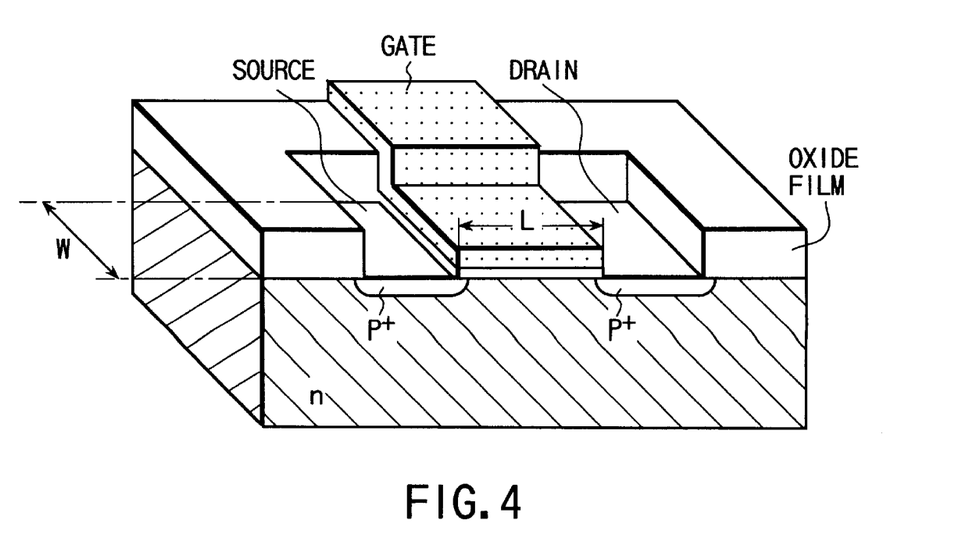
FIG. 4 is a diagrammatic perspective view of a P-channel MOS transistor used in the precharge circuit of FIG. 3.

FIG. 4 is a perspective view of one of the first P-channel MOS transistors connected in series. The source is coupled to the supply voltage Vcc and the gate is connected to the ground potential Vss. Each of the MOS transistors has the same geometry. The gate length L is set sufficiently larger than the gate width W (L>>W). For example, the L/W ratio is selected to be 10 to 20. It is therefore apparent that, since the current is small and the resistance is high, the charging speed is slow. With a 16 M memory, a current of several microamperes flows through the P-channel MOS transistors and the number of P-channel MOS transistors is set such that n=5. The gate length of these transistors is, for example, 10 to 20 times larger than that of transistors used in the inverters, the peripheral control circuit, and internal circuits.

The second P-channel MOS transistors TPBn has a same size and structure as the first P-channel MOS transistors. The number of second P-channel MOS transistors is set such that n=5.

Figure 5A:
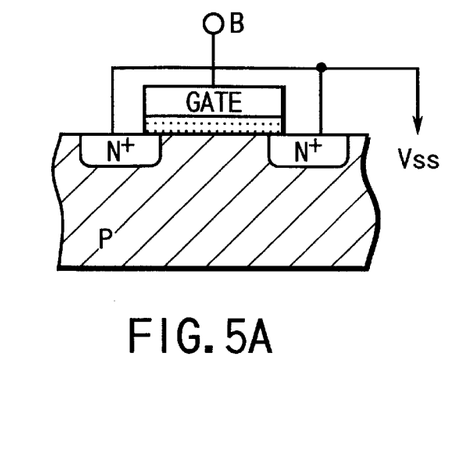
FIG. 5A is a cross-sectional view of an N-channel MOS capacitor used in the precharge circuit of FIG. 3.
Figure 5B:
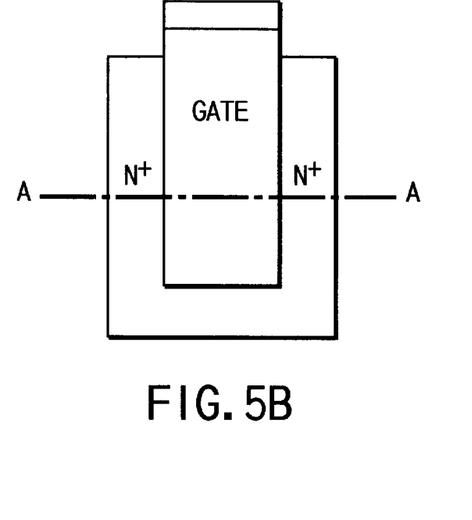
FIG. 5B is a top plan view of the N-channel MOS capacitor shown in FIG. 5A.

FIGS. 5A and 5B are each a schematic representation of the N-channel MOS capacitor C comprising the charged level control circuit 8. More specifically, FIG. 5B is a top plan view of the MOS capacitor. The drain and source regions doped with N-type impurities are shorted to each other to surround the gate as shown. FIG. 5A is a cross-sectional view taken along the line A—A of FIG. 5B. The gate is connected to the node B and the drain and source are connected to Vss.

Figure 6:
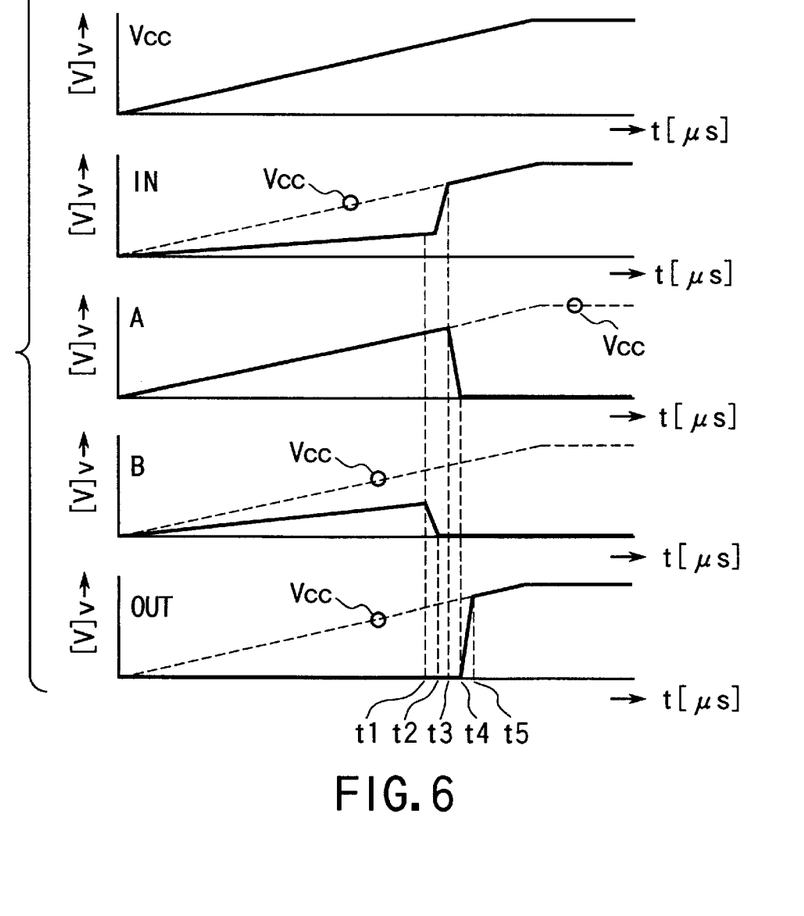
FIG. 6 are timing diagrams illustrating precharged states of respective nodes in the function switching circuit of FIG. 3.

Next, reference will be made to FIG. 6 to describe the operation when the supply voltage is raised instead of applying the supply voltage to the pad. The figure are timing diagrams illustrating the precharged states of the respective nodes in the function switching circuit. As the nodes, there are illustrated the node IN (the node between the pad and the charged level stabilization circuit) on the semiconductor substrate side of the pad 1 to which a signal is externally applied, the node A between the inverters INV1 and INV2, the node B between the gate of the P-channel MOS transistor TPA and the drain of the N-channel MOS transistor TN, and the node OUT between the charged level stabilization circuit and the peripheral control circuit.

When the supply voltage Vcc is raised, the node IN begins to charge slowly toward the supply Vcc through the series-connected P-channel MOS transistors TP1, TP2, . . . , and TPn which have their respective gates connected to Vss. The dotted line shows an imaginary supply voltage Vcc toward which the node IN starts to be charged. The node IN will charge until the threshold voltage Vth of the N-channel MOS transistor TN is reached (time t=t1). Because the second P-channel MOS transistors TPB1, TPB2, . . . , and TPBn have been turned ON until time t1, the node B will charge to Vcc. In this case, the charging speed is suppressed since the MOS capacitor C is connected to the node B. At this point, the node A is maintained at the supply voltage and the node OUT is maintained at ground potential.

When the potential at node IN exceeds the threshold voltage Vth of the N-channel MOS transistor TN, the N-channel MOS transistor turns ON. At time t2, the node B discharges to 0 volts, turning the P-channel MOS transistor TPA ON. The speed at which the node B charges is suppressed by the N-channel MOS capacitor, which results in fast discharge of the node B and fast activation of the MOS transistor TPA. When the transistor TPA turns ON at time t2, the node IN which has been charged slowly until that time through the first P-channel MOS transistors will be quickly charged up to the supply voltage Vcc. That is, after time t2, the node IN is charged mainly through the MOS transistor TPA. The transistor TPA, which is higher in driving capability than the first MOS transistors, permits the node IN to be charged quickly. In other words, the transistor TPA is used to assist the first MOS transistors to charge the node IN. The node IN reaches the supply voltage Vcc at time t3. As a result, the node A goes down to ground potential Vss at time t4. At time t5, the node OUT reaches the supply voltage Vcc, so that the precharging of the function switching circuit terminates.

Figure 7:
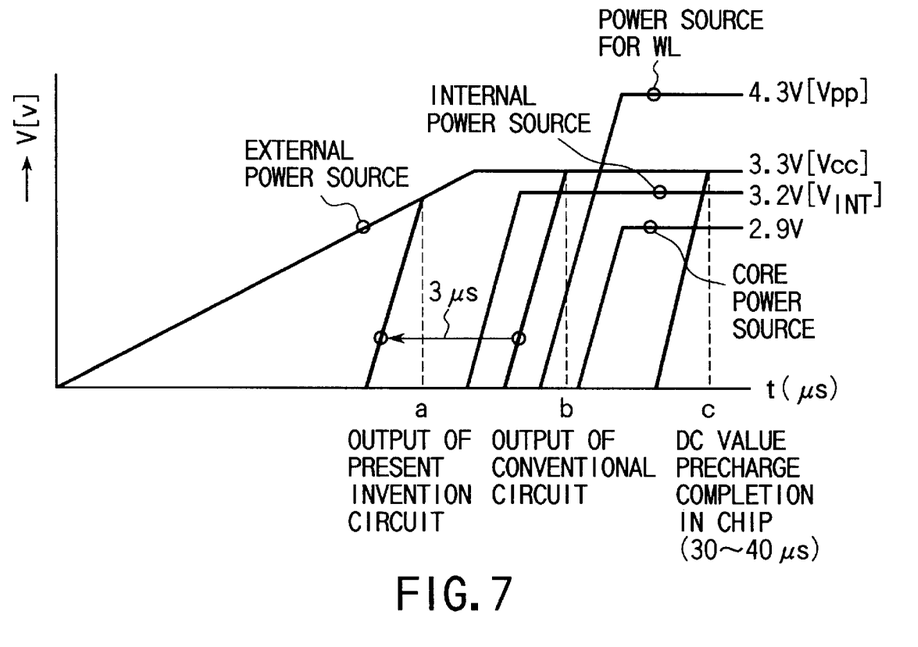
FIG. 7 illustrates the power-on sequence for the precharge circuit of the present invention.

Reference will now be made to FIG. 7 to describe the operation from when an external power source starts to rise until the precharging within a chip is completed. It takes several tens of microseconds, for example, about 37 to 38 microseconds, to reach point c at which the precharging of the external power source Vcc (3.3V), a power source for word lines (WL) (4.3V), an internal power source Vint (3.2V), and a CORE power source (2.9V) is completed. The inventive circuit shown in FIG. 3 provides its output at point a after the external power source has begun to rise. On the other hand, the conventional circuit shown in FIG. 1 provides its output at point b. The inventive circuit provides its output about three microseconds faster than the conventional circuit.

Usually, the inverters INV1 and INV2 in the charged level stabilization circuit 4 are supplied with the external supply voltage Vcc as with the second P-channel MOS transistor TPA comprising the second charge circuit 6. Alternatively, the internal power source voltage Vint may be used. In such a case, the charged level of the charged level stabilization circuit 4 can be stabilized.

Figure 8:
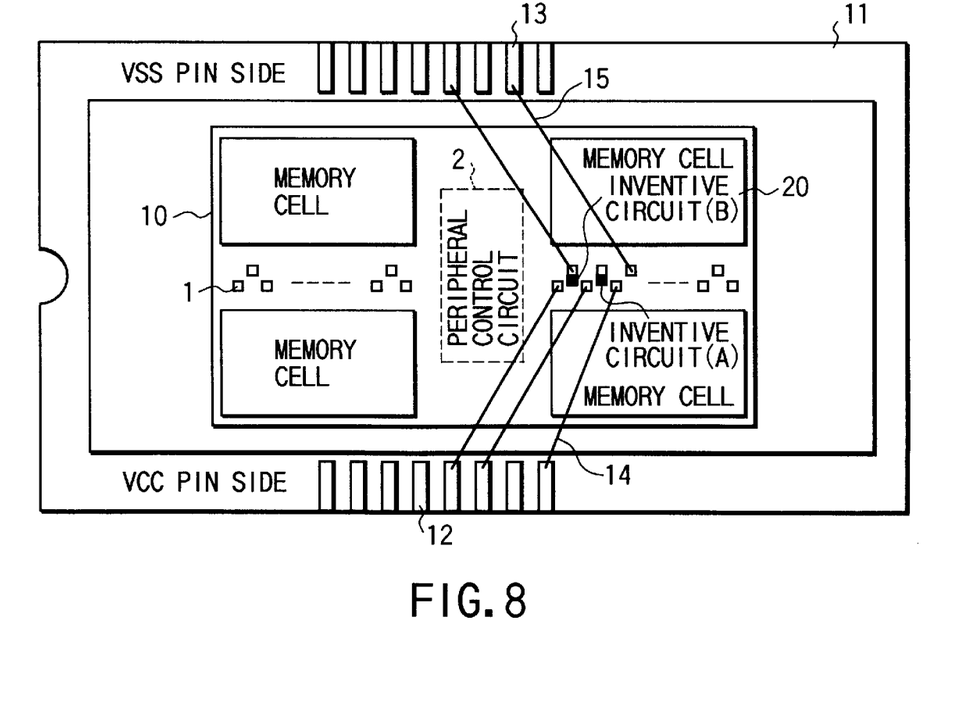
FIG. 8 is a top plan view of a packaged semiconductor chip containing the precharge circuits of the present invention.

Next, the operation of the inventive circuit which is applied to a packaged semiconductor chip will be described with reference to FIGS. 8 and 9, each of which is a top plan view of the packaged semiconductor chip. In FIG. 8, a semiconductor chip 10 has four memories 20 built into. Between long sides of two adjacent memories are formed pads 1 in a staggered fashion. In the central portion of the chip, a peripheral control circuit 2 is formed along short sides of the memories as shown. External terminals are formed on the peripheral portions of the package 11. In the lower portion of the drawing, a plurality of power supply terminals (Vcc pins) 12 are formed, while, on the side opposite to the Vcc pins (the upper portion of the drawing), ground terminals (Vss pins) 13 are formed. Bonding wires are used to connect corresponding pins and pads together. A bonding wire 14 is used to connect a Vcc pin 12 and a pad 1. A bonding wire 15 is used to connect a Vss pin 13 and a pad 1 together. In this case, each Vcc pin is connected to a lower one of the pads arranged in a staggered fashion. Thus, wire bonding is achieved easily without contact between adjacent bonding wires.

Figure 9:
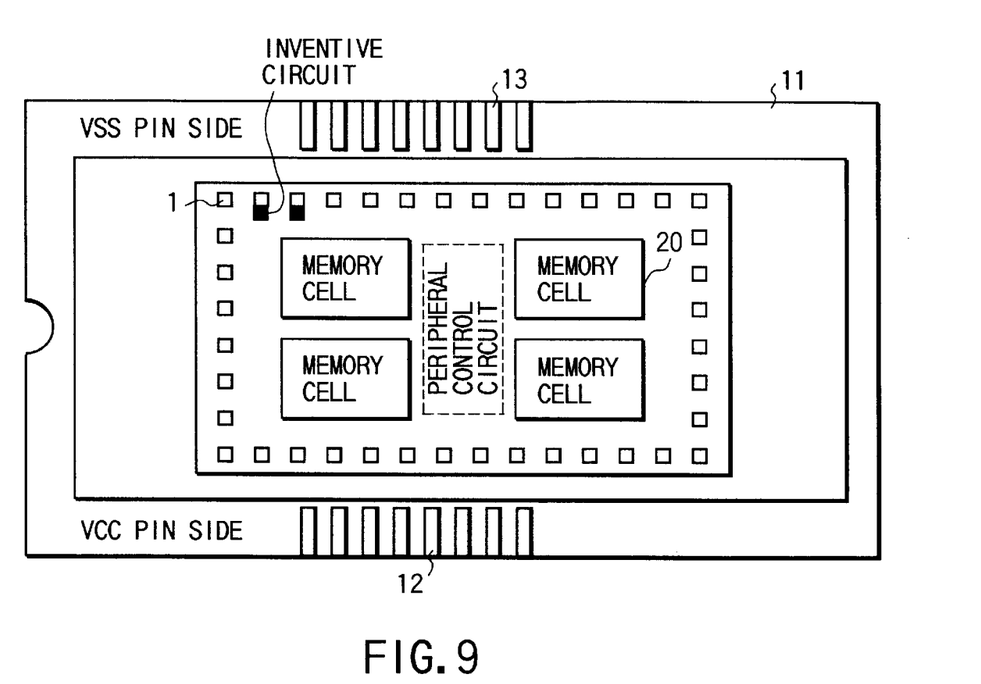
FIG. 9 is a top plan view of a packaged semiconductor chip containing the precharge circuits of the present invention.

Particularly in a case where the pads 1 are formed on the peripheral portions of the semiconductor chip 10 as shown in FIG. 9, it is virtually impossible to connect a Vcc pin to a pad that is located in the proximity to the Vss pins and to connect a Vss pin to a pad that is located in the proximity of the Vcc pins.

The present invention is effectively used in the following manner. That is, when it is desired to supply the supply voltage Vcc through a pad that is associated with the inventive circuit (A) and located on the upper side of the staggered pads (on the Vss side), the inventive circuit (A) is activated to use the precharged supply voltage Vcc. On the other hand, when it is desired to maintain a pad that is associated with the inventive circuit (B) and located on the upper side of the staggered pads (on the Vss side) at ground potential, that pad is connected to a Vss pin 13 by a bonding wire 15 without activating the inventive circuit (B).

Figure 10:
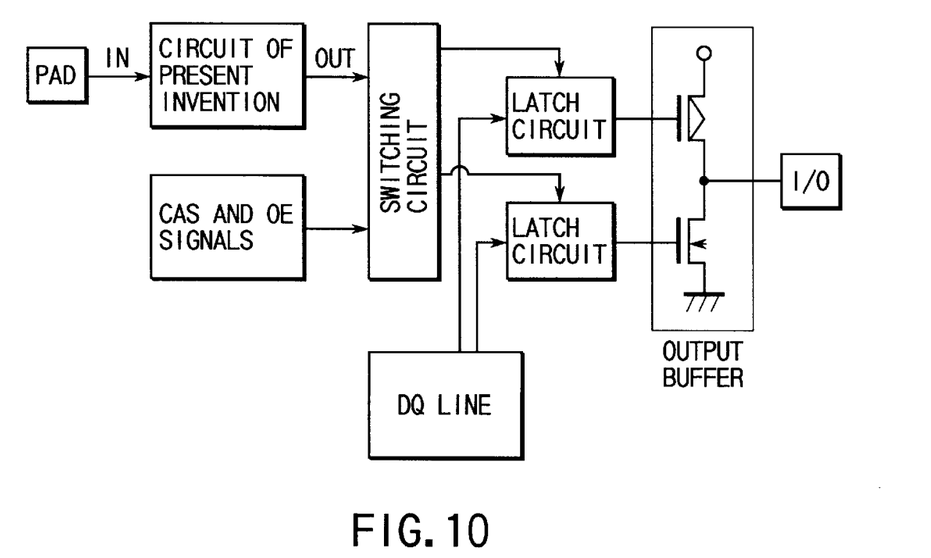
FIG. 10 is a block diagram of an input/output section of a semiconductor integrated circuit containing the precharge circuit of the present invention.
Figure 11:
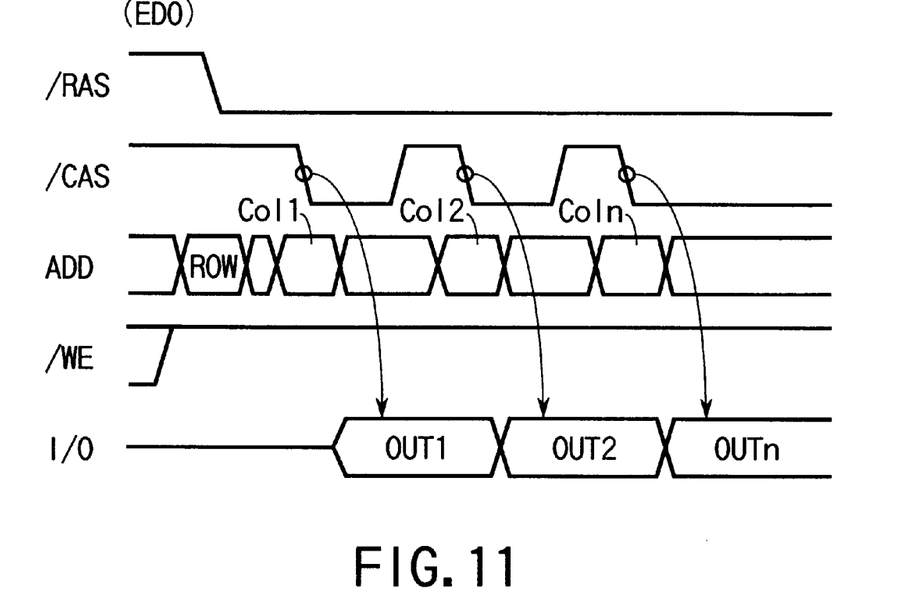
FIG. 11 is a timing diagram of a semiconductor memory to which the present invention is applied.
Figure 12:
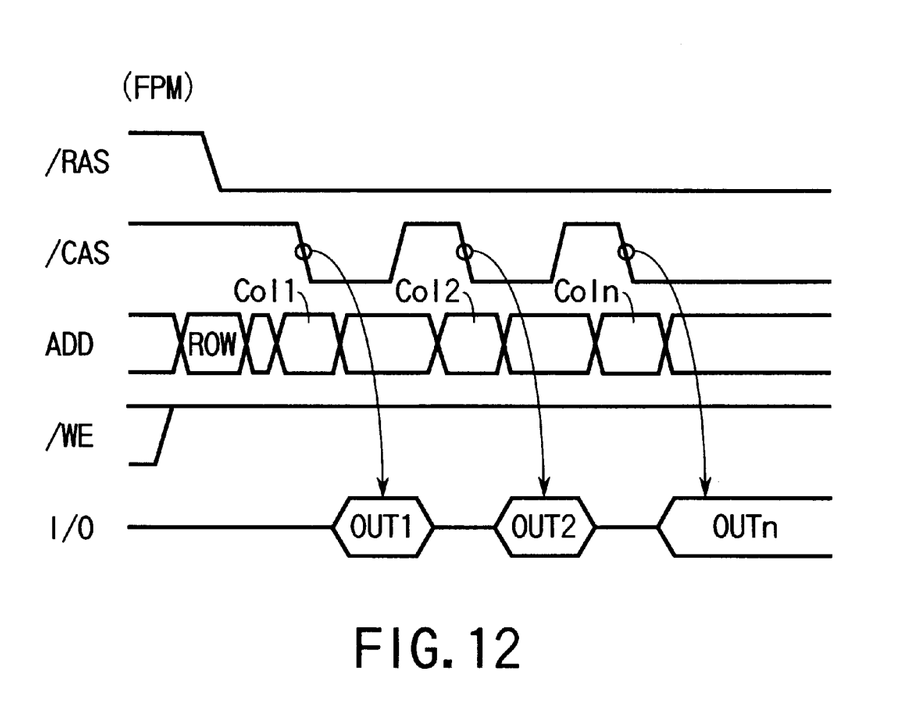
FIG. 12 is a timing diagram of the semiconductor memory to which the present invention is applied.

Next, an application of the present invention to a memory will be described with reference to FIGS. 10, 11 and 12. FIG. 10 is a block diagram of circuitry from a pad associated with the inventive circuit (precharge circuit) to I/O. FIG. 11 is a semiconductor memory EDO (Extended Data Out) timing diagram. FIG. 12 is an FPM (Fast Page Mode) timing diagram. A voltage from the pad or a voltage OUT precharged by the inventive circuit is applied to a switching circuit. A CAS or OE signal for EDO or FPM shown in FIGS. 11 and 12 is applied to the switching circuit. The input voltage or input signal is selected by the switching circuit and then applied to the I/O via an output buffer. With the conventional circuit, the operation of the switching circuit cannot be stabilized before the internal voltage (Vint) becomes stabilized. According to the present invention, however, the operation of the switching circuit can be stabilized quickly because an external voltage as Vcc can be applied quickly to the switching circuit. It causes semiconductor memory to operate in high speed.

As described above, according to the present invention, since a P-channel MOS transistor is added to conventional P-channel MOS transistors to assist precharging, the function switching circuit can be precharged quickly while suppressing current flowing through the p-channel MOS transistors, allowing fast power-on sequence of a semiconductor integrated circuit device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor integrated circuit device including a precharge circuit comprising:

a first charge circuit for charging a node to a predetermined potential;

a second charge circuit for charging the node to the predetermined potential, the second charge circuit being higher in charging speed than the first charge circuit;

a charged level detect circuit for detecting a charged level of the node and driving the second charge circuit when the first charge circuit charges the node to a predetermined charged level lower than the predetermined potential;

a charged level stabilization circuit for outputting a substantially fixed potential when the charged level of the node is over the predetermined charged level lower than the predetermined potential; and a charged level control circuit for expediting activation of the second charge circuit, the charged level control circuit being coupled to the second charge circuit and expediting the activation of the second charge circuit when the first charge circuit charges the node to the predetermined charged level.

2. A semiconductor integrated circuit device comprising:

a first P-channel MOS transistor having a gate connected to a ground potential terminal and a drain connected to a power supply voltage terminal;

a first CMOS inverter having an input terminal connected a source of the first P-channel MOS transistor;

a second inverter having an input terminal connected to an output terminal of the first inverter;

a second P-channel MOS transistor having a gate connected to the source of the first P-channel MOS transistor and a drain connected to the power supply voltage terminal;

an N-channel MOS transistor having a gate connected to the source of the first P-channel MOS transistor, a source connected to the ground potential terminal and a drain connected to a source of the second P-channel MOS transistor;

a capacitor connected between the drain of the N-channel MOS transistor and the ground potential terminal; and a third P-channel MOS transistor having a gate connected to the drain of the N-channel MOS transistor, a drain connected to the power supply voltage terminal, and a source connected to the source of the first P-channel MOS transistor.

3. The semiconductor integrated circuit device according to claim 2, wherein the first and the second P-channel MOS transistor include a same number of subtransistors connected in a series.

4. The semiconductor integrated circuit device according to claim 2, wherein a size of the first P-channel transistor is substantially the same as that of the second P-channel transistor.

5. The semiconductor integrated circuit device according to claim 4, wherein a ratio of a gate length to a gate width of each of the first and the second P-channel transistor is more than 10.

6. A method for precharging a semiconductor integrated circuit device having a first charge circuit for charging a node to a predetermined potential, a second charge circuit for charging the node to the predetermined potential higher in charging speed than the first charge circuit, a charged level detect circuit for detecting a charged level of the node, and a charged level control circuit for expediting activation of the second charge circuit and being coupled to the second charge circuit, comprising the steps of:

driving the first charge circuit which is low in charging speed;

detecting the charged level of the first charge circuit by means of the charged level detect circuit; and driving the second charge circuit which is high in charging speed after a predetermined charged level is detected by the charged level detect circuit, wherein the charged level control means decreases an increasing rate at which a potential for driving the second charge means rises.

* * * * *